(12) United States Patent
Lynn et al.

(10) Patent No.: US 6,271,784 B1
(45) Date of Patent: *Aug. 7, 2001

(54) CAPACITOR-BASED DIGITAL-TO-ANALOG CONVERTER WITH CONTINUOUS TIME OUTPUT

(75) Inventors: Lapoe E. Lynn, Somerville; Paul F. Ferguson, Jr., North Andover; Hae-Seung Lee, Bedford, all of MA (US)

(73) Assignee: Analog Devices, Inc., Norwood, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/909,650

(22) Filed: Aug. 12, 1997

(51) Int. Cl.[7] .................................................. H03M 1/66
(52) U.S. Cl. ............................................ 341/150; 330/150
(58) Field of Search ................................... 341/150, 144, 341/122, 153; 330/9, 150, 250

(56) References Cited

U.S. PATENT DOCUMENTS

| | | | |
|---|---|---|---|
| 4,404,479 | * 9/1983 | Toyomaki | 341/122 |
| 4,587,443 | * 5/1986 | Van De Plassche | 341/122 |
| 4,728,811 | * 3/1988 | Iida et al. | 307/112 |
| 5,258,664 | * 11/1993 | White | 341/122 |
| 5,708,376 | * 1/1998 | Ikeda | 327/50 |

* cited by examiner

Primary Examiner—Peguy JeanPierre
(74) Attorney, Agent, or Firm—Samuels, Gauthier & Stevens, LLP

(57) ABSTRACT

A digital-to-analog converter (DAC) including an array of switched input capacitors which store samples of charge proportional to a digital input signal, and an analog output circuit which integrates the samples of charge to generate an output analog signal that is proportional to said digital input signal. The capacitors store a binary representation of the digital input signal. The output circuit includes a zeroth order sample-and-hold circuit having first and second stages with respective first and second operational amplifiers. The first and second stages are cascaded together during a sample phase so that the analog output signal is stored in a capacitor in a feedback path between the output of the second stage and the input of the first stage, and are disconnected from one another during a hold phase so that the first stage is auto-zeroed and the second stage holds the analog output signal as a continuous time output.

36 Claims, 7 Drawing Sheets

CAPACITOR-BASED DIGITAL-TO-ANALOG CONVERTER WITH CONTINUOUS TIME OUTPUT

BACKGROUND OF THE INVENTION

The invention relates to a digital-to-analog converter using switched capacitors to produce a continuous time output.

A general trend in the integrated circuit industry is towards higher integration. Particularly in consumer markets such as portable communications, computer products, etc., higher levels of integration result in a smaller bill of materials, and therefore, power, area and cost savings. The performance parameters of circuits targeted for a highly integrated application specific integrated circuit (ASIC) can be very different from those of a general purpose circuit with the same function. Therefore, the design of such circuits should be approached differently. In the design of general purpose digital-to-analog converters (DACs), switched-capacitor charge redistribution structures have largely been avoided for a variety of reasons, including the need for a clock and the desire to avoid switching noise on the continuous time output of the DAC. Instead, attention has focused more heavily on switched-current or resistive ladder techniques.

In conventional standard mixed signal IC technology, polysilicon capacitors provide the best component matching per unit of area. It makes sense, therefore, to use poly—poly capacitors as the basic unit element in a high resolution converter. Especially in highly integrated mixed signal chips where a clock is readily available, a capacitor based DAC can save area and power over structures which rely on matching currents or voltages in transistors and/or resistors.

SUMMARY OF THE INVENTION

The invention provides a technique for implementing capacitor based charge-redistribution DACs suitable for small area, low power, and high accuracy implementations. The proposed architecture incorporates a capacitor array which implements the D/A function, a zeroth order sample and hold, and an output amplifier all into a single compact structure.

A digital-to-analog converter is provided which uses switched capacitors as the basic DAC elements. The use of switching capacitors provides excellent matching without sacrificing die area, and allows for very low-power operation. However, the architecture provides significant challenges when used in a continuous-time application requiring a smooth output.

Accordingly, the invention provides a digital-to-analog converter (DAC) including an array of switched input capacitors which store samples of charge proportional to a digital input signal, and an analog output circuit which combines the samples of charge to generate an output analog signal that is proportional to said digital input signal. The capacitors can be binary-weighted or otherwise capable of storing a binary representation of the digital input signal.

The output circuit includes a zeroth order sample-and-hold circuit having at least first and second amplifier stages. The first and second stages are cascaded together during a sample phase so that the analog output signal is generated on an output node, and is stored on a capacitor in a feedback path between the input and output of the second stage. The two stages are disconnected from one another during a hold phase so that the first stage is auto-zeroed and the second stage holds the analog output signal as a continuous time output.

In one aspect of the invention, the sample-and-hold circuit further includes a third amplifier stage cascaded between the first stage and a node between the feedback capacitor and the output of the second stage during a precharge phase so that parasitic capacitance at the node is driven to the value of the analog output signal to prevent undesirable glitching on the output node when the feedback capacitor is reconnected.

In another aspect of the invention, the first amplifier is configured as an inverting amplifier during the sample phase, and reconfigured as a non-inverting amplifier during the hold phase.

DETAILED DESCRIPTION OF THE ILLUSTRATED EMBODIMENTS

Figure 1:
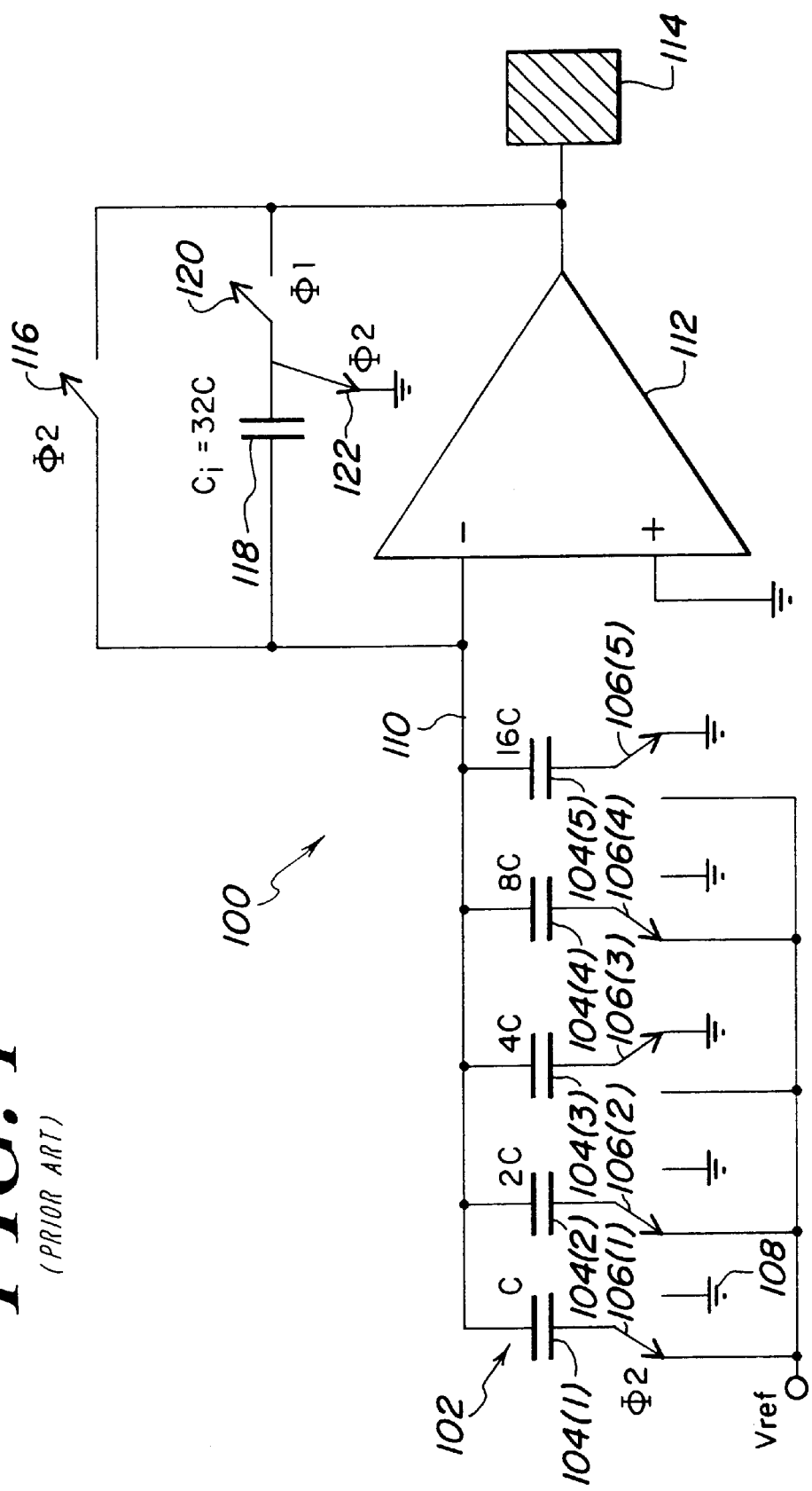
FIG. 1 is a schematic diagram of an example of a standard switched-capacitor based charge redistribution DAC which does not produce a smooth, continuous-time output.

FIG. 1 is a schematic diagram of the architecture of a standard switched-capacitor based charge redistribution DAC 100. It is important to understand the operation of the DAC 100 in order to fully understand the embodiments of the invention. Samples of charge proportional to the unit capacitor value C, the reference voltage $V_{ref}$, and the digital input word are sampled onto the array of input capacitors 102 during phase $\Phi_2$. In the illustrated embodiment, the array of input capacitors 102 includes 5 capacitors 104(1)–104(5) respectively valued at C, 2C, 4C, 8C and 16C. The capacitors are switched, via respective switches 106(1)–106(5) to either $V_{ref}$ or ground 108. As illustrated, the reference voltage is applied to capacitors 106(1), 106(2) and 106(4) during $\Phi_2$, thus representing a binary value of "11000".

A common output line 110 from the input capacitors is coupled to the inverting input of an operational amplifier 112. The amplifier is configured to include a feedback arrangement with parallel paths between an output node 114 and the inverting input. The first path includes a switch 116, and the second path includes a feedback capacitor 118 and switches 120 and 122. The switch 120 completes the feedback path through the capacitor 118 from inverting input to the output node, while the switch 122 serves to connect the capacitor 118 to AC ground.

During phase $\Phi_1$, previously stored charge from the input capacitors 102 are summed onto the feedback capacitor 118 ($C_f$) to generate an output proportional to the input word. The switch 116 has a dual purpose. It removes charge on a sample-by-sample basis from the feedback capacitor, and at the same time, together with capacitors 104(1)–104(5), it auto-zeros the amplifier 112, preventing the offset of the amplifier from appearing at the output node 114. Unfortunately, any charge redistribution converter will require the removal of each charge sample from the feedback capacitor in order for the following sample to be processed. This means that a sample and hold, and more specifically a zeroth order sample and hold, is required in order to avoid producing the reset voltage on the output node every cycle.

Figure 2:
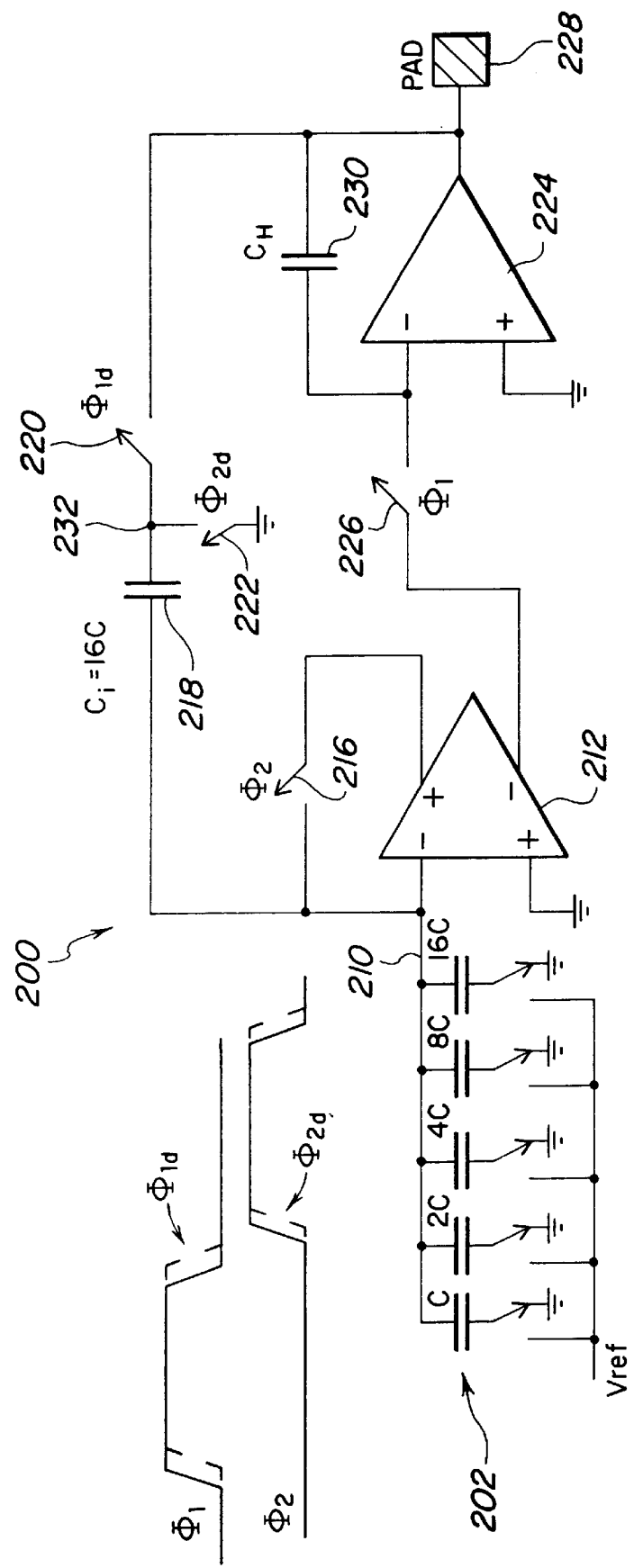
FIG. 2 is a schematic diagram of a switched-capacitor based charge redistribution DAC in accordance with an exemplary embodiment of the invention.

FIG. 2 is a schematic diagram of an exemplary embodiment of a switched-capacitor based charge redistribution DAC 200 in accordance with the invention. The DAC 200 involves a modification to the basic structure of DAC 100 which allows the output to be held at its previous value, while the feedback capacitor is being reset. In this case, the amplifier has been split into two independent amplifiers.

Accordingly, the DAC 200 includes an array of input capacitors 202, each capacitor being switched to either $V_{ref}$ or ground to obtain a binary equivalent of an input digital word. A common output line 210 from the array of capacitors is connected to the inverting input of a first amplifier 212. The amplifier 212 has a feedback path from a non-inverting output with a switch 216 therein.

The inverting output of the amplifier 212 is coupled to the inverting input of a second amplifier 224 via a switch 226. A compensation capacitor 230 is disposed in the feedback between the output node 228 and the inverting input of amplifier 224. In addition, a feedback path is provided between the output node 228 and the inverting input of the first amplifier 212. The feedback path includes a feedback capacitor 218 and switches 220 and 222. The switch 220 completes the feedback path from the output node 228 and the inverting input of amplifier 212, while the switch 222 serves to connect the capacitor 218 to ground.

During phase $\Phi_2$ when the previous output value is being removed from the feedback capacitor 218 ($C_i$), the output is held constant on capacitor 230 ($C_H$). When a new digital word is to be evaluated during phase $\Phi_1$, the two amplifiers are cascaded together into a two stage amplifier, and $C_H$ effectively becomes the compensation capacitor for a single op-amp comprising the cascade of the amplifier 212 and the amplifier 224. In other words, during phase $\Phi_1$, the new structure operates just like DAC 100 of FIG. 1, and during phase $\Phi_2$, the first half of the two stage amplifier is used to autozero the DAC, while the second half of the two stage amplifier is used to hold the continuous time output stable at the previous value.

Figure 3:
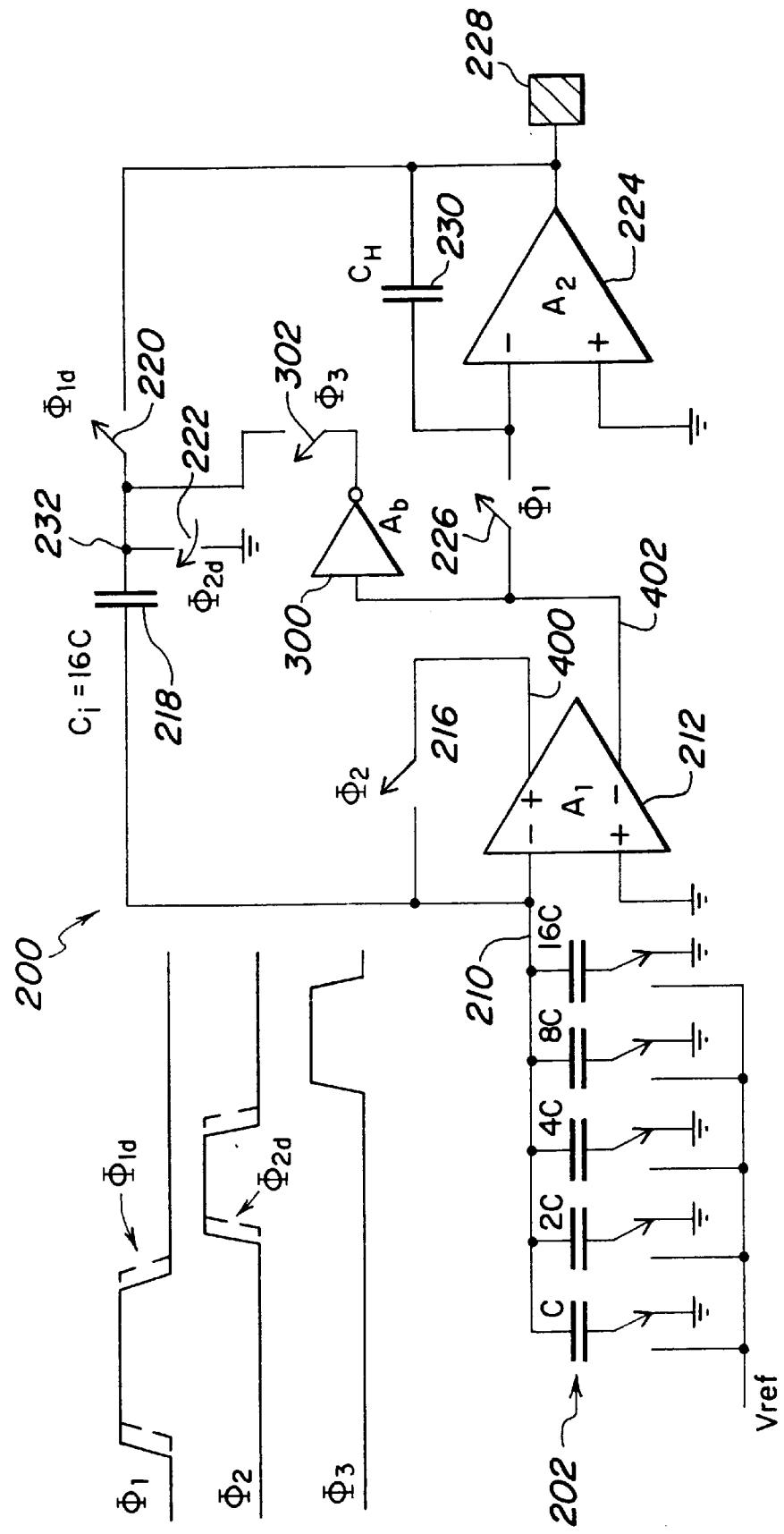
FIG. 3 is a schematic diagram of an alternative embodiment of the DAC of FIG. 2.

Ideally, the first amplifier 212 in FIG. 2 (and FIG. 3) must be a non-inverting amplifier for the feedback around the amplifier cascade to be stable. Therefore, amplifier 212 is reconfigured as an inverting amplifier in the auto-zero phase ($\Phi_2$), and as a non-inverting amplifier in the hold phase ($\Phi_1$). This configuration is illustrated in FIG. 3, where a non-inverting output 400 of amplifier 212 is coupled to the inverting input via switch 216, and an inverting output 402 is coupled to the inputs of amplifiers 224 and 300.

The auto-zero function of DAC 200 removes the offset of the first amplifier 212. The offset of the second amplifier 224 gets divided by the gain of the first stage when referred to the input. This auto-zeroing also serves to remove low frequency (1/f) noise of the amplifier, since it essentially amounts to a correlated double-sampling of the input referred noise of the first amplifier. Furthermore, this configuration can also be used to drive the output directly, removing the need for an extra output amplifier altogether.

Since the switched capacitors in DAC 200 consume no static power, the power consumption of this architecture is determined solely by the amplifiers; whereas other architectures would have power dissipated in the DAC core as well as in an additional output amplifier. In the embodiment of FIG. 2, the integrating capacitor 218 has been sized to include a gain of 2× in the DAC function as well. While any reasonable value of gain may be chosen, an experimental implementation of the invention included this gain of 2 and also used the feedback capacitor as a sampling capacitor for the most significant bit of the DAC, thus saving a significant percentage of the capacitor array area. It is also possible to use the entire array as the feedback capacitor for a gain of 1.

In order to minimize the effects of charge injection, non-overlapping clocks $\Phi_1$ and $\Phi_2$ (shown in FIG. 2) are used to control the switches performing the sampling operation, and delayed versions of $\Phi_1$ and $\Phi_2$ are used to control all other switches. Charge injection from switch 216 ($\Phi_2$) will only affect the auto-zeroed value of the first amplifier 212, and may cause a few mVs of offset. Charge injection from opening switch 226 ($\Phi_1$) will cause a small pedestal to appear on the output node 228 as the DAC 200 goes into a sample mode ($\Phi_2$). A small square wave at the clock frequency will be seen due to this pedestal on the output node 228 as the DAC switches between sample and hold modes. This switching noise is signal independent (provided the gain of the second amplifier 224 is sufficiently high) and will only cause a small offset on the DC component of the output.

A more troublesome side effect of this topology is the charge sharing that occurs when switch 220 ($\Phi_{1d}$) is closed. Note that during phase $\Phi_{2d}$ the right side of the capacitor 218 ($C_i$) in FIG. 2, shown as node 232, is reset to a DC potential (in this case, ground). During this time, the output is held at it's pervious value on capacitor 230 ($C_H$). However, when switch 220 ($\Phi_{1d}$) is closed, charge on capacitor 218 and the parasitic capacitance at node 232 gets shared with the charge on the output node 228, thus causing the output to spike before the action of the closed loop amplifier can drive the output to the next value.

To alleviate this glitching, a third phase ($\Phi_3$) is added between phases $\Phi_1$ and $\Phi_2$. FIG. 3 is a schematic diagram of an alternative embodiment of the DAC 200 of FIG. 2. During phase $\Phi_3$, a switch 302 is closed to connect a small amplifier 300 between the inverting output and the node 232. The amplifier 300 is used to drive the parasitic capacitance at node 232 to the output value. When phase $\Phi_1$ arrives, node 232 and the output node 228 are connected through switch 220 ($\Phi_{1d}$), but node 232 has already been driven to the correct voltage. Accordingly, no glitch occurs as the large second amplifier 224 drives the output node 228 to the correct voltage as well.

Figure 4:
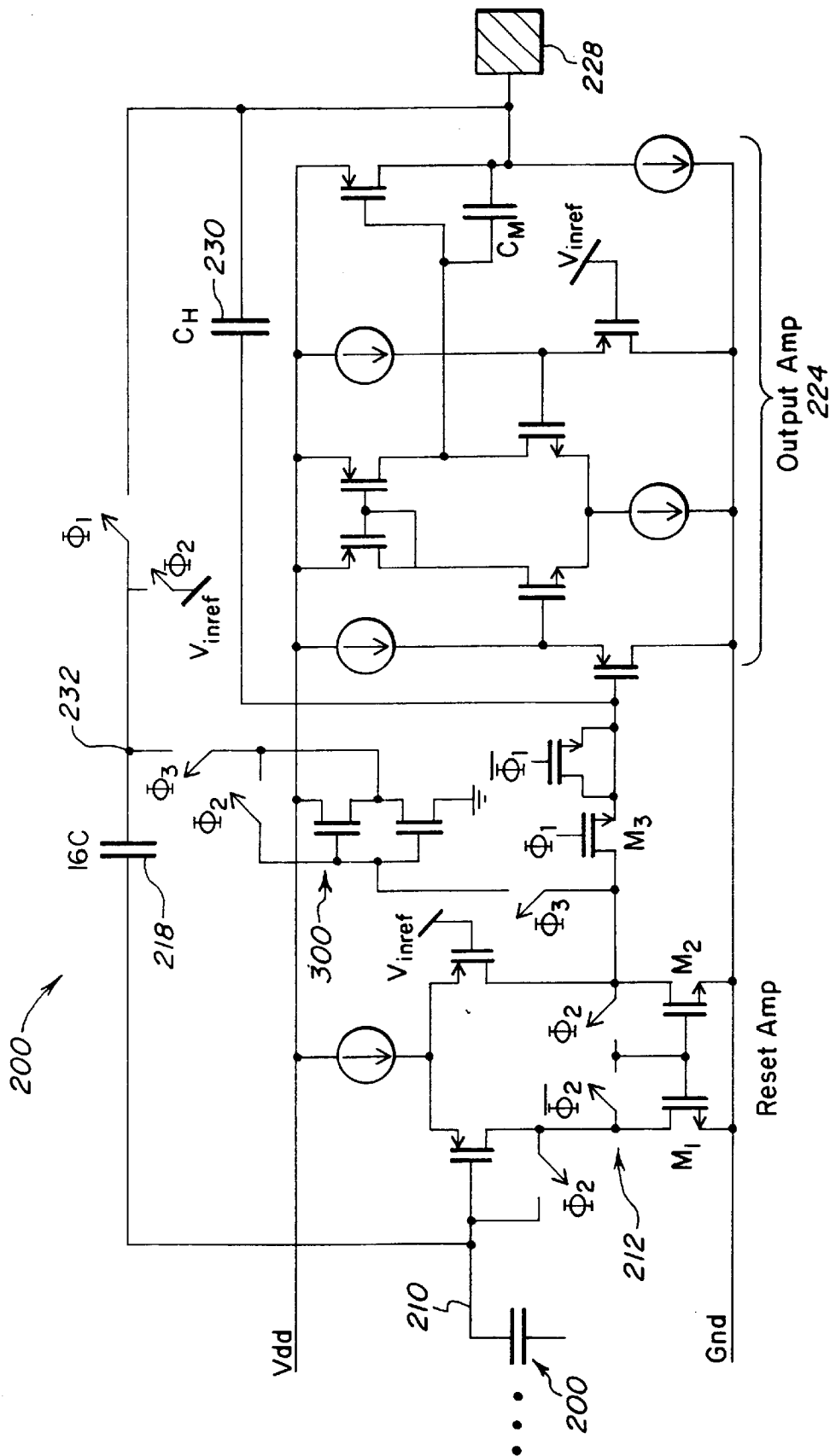
FIG. 4 is a simplified schematic diagram showing the implementation of the DAC of FIG. 3 with MOSFETs illustrating the zeroth-order sample and hold circuit implementation.

FIG. 4 is a simplified schematic diagram showing the implementation of the DAC 200 with MOSFETs using the zeroth-order sample and hold circuit of the invention. Amplifier 212 is labeled as the "reset amp", amplifier 224 is labeled as the "output amp", and the bootstrapping amplifier 300 is shown in shaded lines.

The polarity change on amplifier 212 is accomplished by switching the polarity on the active mirror load $M_1$–$M_2$. Transistor $M_3$ samples charge on the holding capacitor $C_H$, and therefore has a charge cancellation switch associated with it. The bootstrapping amplifier is implemented as a very small, carefully sized digital inverter. Amplifier 224 is a standard 2-stage op-amp designed to drive a 50 kΩ, 50 pF load rail to rail. Therefore, when amplifiers 212 and 224 are cascaded together, a three stage amplifier is formed. Care must be taken in the choice of capacitor $C_H$ since it not only holds charge during the hold phase, it also acts as the outside compensation loop of the nested-miller compensation that keeps the amplifier cascade stable. Amplifier 224 consumes a majority of the power in the entire DAC (≈80%).

Figure 5:
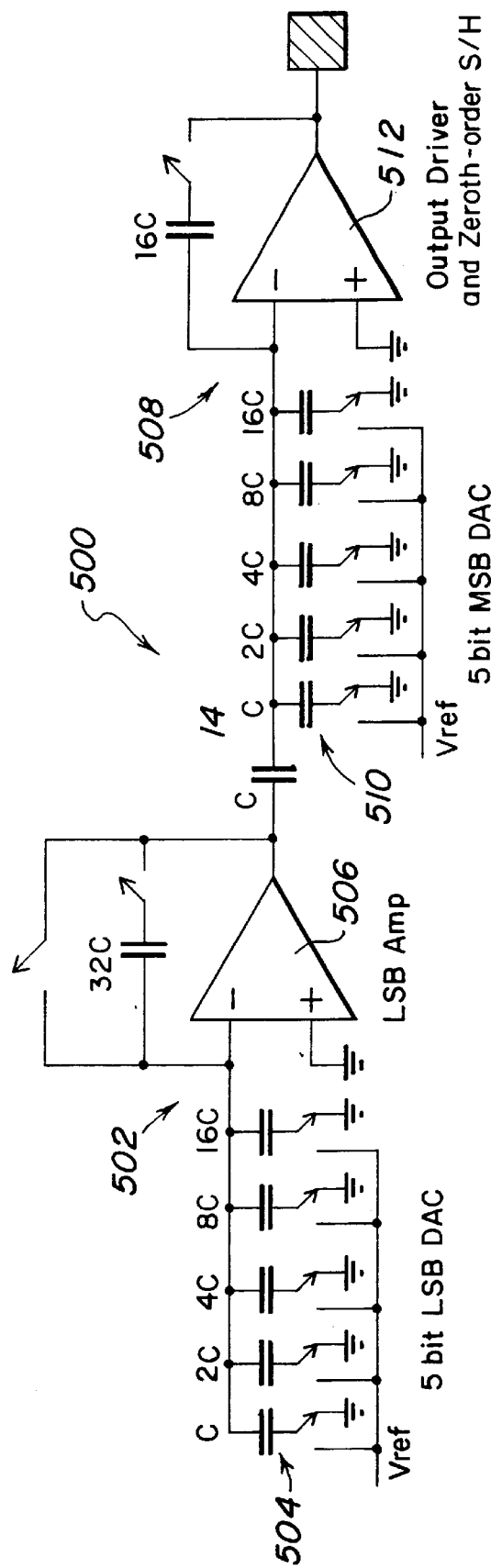
FIG. 5 is a schematic diagram of a 10 bit DAC that has been segmented into two 5 bit arrays in accordance with an embodiment of the invention.

The capacitor array 202 shown in the previous figures represent a 5-bit binary weighted DAC, but the structure can easily be extended to higher resolution by increasing the size of the input array. FIG. 5 is a schematic diagram of a 10 bit DAC 500 that has been segmented into two 5 bit arrays in accordance with an embodiment of the invention.

The DAC 500 includes a least significant bit (LSB) segment 502 having a 5 bit capacitor array 504 and an amplifier 506 configured similarly to the DAC 100 of FIG. 1, and a most significant bit (MSB) segment 508 which is configured as in FIG. 4 in accordance with an exemplary embodiment of the invention and includes a 5 bit capacitor array 510 and an amplifier 512. A single capacitor 514 is disposed at the junction of the output of the LSB DAC and the input of the MSB DAC. A small amplifier and feedback capacitor have been added to the LSB array to make the LSB segment parasitic insensitive. The amplifier can be very small or can be omitted entirely if care is taken with layout parasitics.

The topology of DAC 200 shown in FIG. 2, combines the basic charge redistribution DAC function with a zeroth order sample and hold, and an output amplifier. Several DACs based on this architecture have been designed and characterized. Despite using binary-weighted arrays in two 5 bit segments, 10 bit linearity (<11sb DNL, <11sb INL) is achieved with a compact 500 $\mu$m×600 $\mu$m experimental structure (~0.46 k sq. mils). A slightly larger experimental structure (500 $\mu$m×1000 $\mu$m) included an 8 bit coarse DAC overlapped with a 10 bit fine DAC for 13 bits overall. This DAC has been implemented with standard 0.6 $\mu$m CMOS process, and was optimized for low power and consumed 250 $\mu$A from a 3 volt supply at a 45 kHz update rate. The power was reduced further (<200 $\mu$A) in a low-power mode where an on-chip oscillator was used to keep the DAC refreshed without the need for an external clock.

While the experimental capacitors were implemented as polysilicon-polysilicon capacitors, other types can be utilized, such as metal-metal, metal-polysilicon, etc. The amplifiers and switches were implemented using MOSFETS as shown in FIG. 4.

Figure 6:
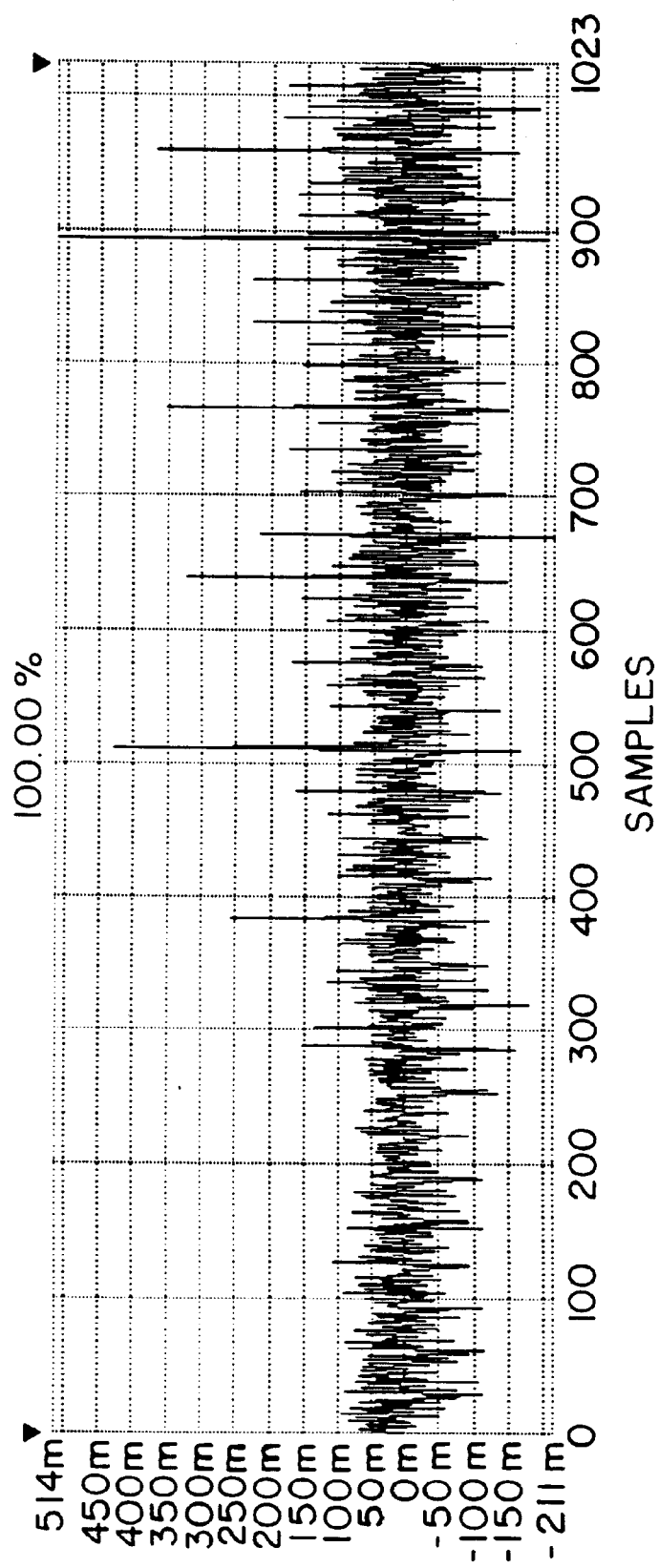
FIG. 6 is a plot of measured DNL, in milli-LSBs, for the 10 bit fine DAC shown in FIG. 5.
Figure 7:
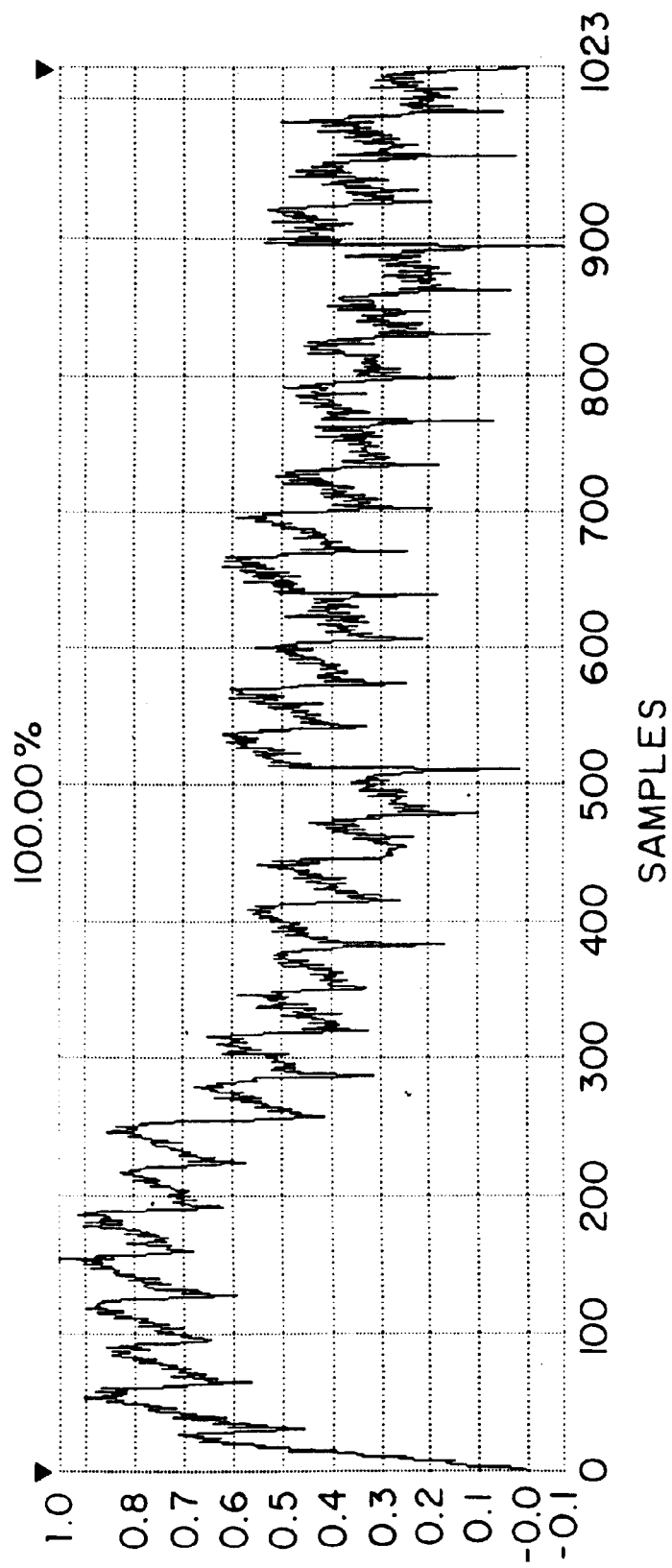
FIG. 7 is a plot of measured INL, in LSBs, for the 10 bit fine DAC shown in FIG. 5.

FIG. 6 is a plot of measured DNL, in milli-LSBs, for the 10 bit fine DAC shown in FIG. 5. FIG. 7 is a plot of measured INL, in LSBs, for the 10 bit fine DAC shown in FIG. 5. The DAC 500 was used as part of a frequency control loop in digital cellular phones. The output of the DAC regulates the frequency of the master oscillator in the phone. Since tight control over the frequency of the master clock must be maintained even when the phone is in standby, the power consumption of the DAC is one of the key determinants of phone battery life. The use of this architecture in experimental devices consumed less area, and approximately 75% less current than conventional designs.

Although the illustrated embodiments of the invention described with reference to FIGS. 1–5 all provide a single analog output, it is straightforward to extend the invention to a fully differential implementation. Such an implementation would naturally exhibit all the benefits (improved PSRR, etc . . . ) that differential circuits normally enjoy.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

What is claimed is:

1. A device comprising:
    a plurality of charge storage elements which store samples of charge proportional to a digital input signal; and
    an analog output element which processes said samples of charge to generate an analog output signal that is proportional to said digital input signal, wherein said analog output circuit comprises a zeroth order sample-and-hold circuit and at least one charge storage element that couples the input and output of said analog output element, wherein
    said sample-and-hold circuit comprises first and second amplifier stages which are cascaded together during a sample phase so that said first and second stages comprise a single operational amplifier and so that said analog output signal is stored in a storage element in a feedback path between an output of said second stage and an input of said first stage, said first stage comprising a transconductance-type amplifier.

2. The device of claim 1, wherein said plurality of charge storage elements comprise an array of switched input capacitors.

3. The device of claim 2, wherein said array of switched capacitors comprises N capacitors having binary weighting.

4. The device of claim 3, wherein said N capacitors store a binary representation of said digital input signal.

5. The device of claim 1, wherein said sample-and-hold circuit comprises first and second amplifier stages which are cascaded together during a hold phase so that said first and second stages comprise a single operational amplifier and so that said analog output signal is stored in a storage element in a feedback path between an output of said second stage and an input of said first stage.

6. The device of claim 5, wherein said first and second amplifier stages comprise first and second amplifiers, respectively.

7. The device of claim 5, wherein said first and second amplifier stages are disconnected from one another during a sample phase so that said first stage is auto-zeroed and said second stage holds said analog output signal as a continuous time output.

8. The device of claim 7, wherein said sample-and-hold circuit further comprises a third amplifier cascaded between said first stage and a node between said storage element and the output of said second stage during a precharge phase so that parasitic capacitance at said node is driven to the value of said analog output signal.

9. The device of claim 8, wherein said first amplifier stage is configured as an inverting amplifier during said sample phase, and reconfigured as a non-inverting amplifier during said hold phase.

10. The device of claim 5, wherein said storage element comprises a capacitor.

11. A digital-to-analog converter (DAC) comprising:
    an array of switched input capacitors which store samples of charge proportional to a digital input signal; and
    an analog output circuit which couples said samples of charge to generate an output analog signal that is proportional to said digital input signal, wherein said output circuit comprises a zeroth order sample-and-hold circuit and at least one capacitor that couples the input and output of said analog output element during a hold phase of said sample-and-hold circuit, wherein said sample-and-hold circuit comprises first and second stages having respective first and second amplifiers and wherein said first and second stages are cascaded together during a sample phase so that said first and second stages comprise a single operational amplifier and so that said analog output signal is stored in a storage element in a feedback path between an output of said second stage and an input of said second stage, said first stage comprises a transconductance-type amplifier.

12. The DAC of claim 11, wherein said array of switched capacitors comprises N capacitors having binary weighting.

13. The DAC of claim 12, wherein said N capacitors store a binary representation of said digital input signal.

14. The DAC of claim 11, wherein said sample-and-hold circuit comprises first and second stages having respective first and second amplifiers.

15. The DAC of claim 14, wherein said first and second stages are cascaded together during a hold phase so that said first and second stages comprise a single operational amplifier and so that said analog output signal is stored in a storage element in a feedback path between an output of said second stage and an input of said first stage.

16. The DAC of claim 15, wherein said first and second stages are disconnected from one another during a hold phase so that said first stage is auto-zeroed and said second stage holds said analog output signal as a continuous time output.

17. The DAC of claim 16, wherein said sample-and-hold circuit further comprises a third amplifier cascaded between said first stage and a node between said integrating capacitor and the output of said second stage during a precharge phase so that parasitic capacitance at said node is driven to the value of said analog output signal.

18. The DAC of claim 17, wherein said first stage amplifier is configured as an inverting amplifier during said sample phase, and reconfigured as a non-inverting amplifier during said hold phase.

19. A device comprising;
   a plurality of charge storage elements which store samples of charge proportional to a digital input signal; and
   an amplifying circuit with an output hold function having at least one input and at least one output terminals, wherein a control signal sets the operation to either amplify or hold phase; and
   a feedback circuit for coupling the output and the input of said amplifying circuit so that an output signal is that is proportional to said digital input signal is produced during the amplify phase, wherein
   said amplifying circuit comprises first and second amplifier stases which are coupled by a switch means so that during an amplify phase said first and second stages comprise a single operational amplifier.

20. The device of claim 19, wherein said plurality of charge storage elements comprise an array of switched input capacitors.

21. The device of claim 20, wherein said array of switched capacitors comprises N capacitors having binary weighting.

22. The device of claim 21, wherein said N capacitors store a binary representation of said digital input signal.

23. The device of claim 19, wherein said first and second amplifier stages comprise first and second amplifiers, respectively.

24. The device of claim 19, wherein said first and second amplifier stages are disconnected from one another during a hold phase so that said second stage holds said analog output signal.

25. The device of claim 24, wherein said first stage is auto-zeroed during the hold phase.

26. The device of claim 25, wherein said amplifying circuit further comprises a third amplifier cascaded between said first stage and a node between said feedback circuit and the output of said second stage during a precharge phase so that parasitic capacitance at said node is driven to the value of said analog output signal.

27. The device of claim 26, wherein said first amplifier stage is configured as a non-inverting amplifier during said amplify phase, and reconfigured as an inverting amplifier during said hold phase.

28. The device of claim 19, wherein said feedback circuit comprises a capacitor.

29. A digital-to-analog converter comprising;
   and array of switched input capacitors which store samples of charge proportional to a digital input signal; and
   an analog output circuit which couples said samples of charge to generate an analog output signal that is proportional to said digital input signal, wherein
   said output circuit comprises an amplifying circuit with an output hold function, and wherein a control signal sets the operation to either amplify or hold phase, and at least one capacitor that couples the input and output of said analog output circuit during the hold phase, said amplifying circuit comprising a transconductance-type amplifier, wherein
   said amplifying circuit comprises first and second stages, said first and second stages are cascaded together during an amplify phase so that said first and second stages comprise a single operational amplifier.

30. The converter of claim 29, wherein said array of switched capacitors comprises N capacitors having binary weighting.

31. The converter of claim 30, wherein said N capacitors store a binary representation of said digital input signal.

32. The converter of claim 29, wherein said amplifying circuit comprises first and second stages having respective first and second amplifiers.

33. The converter of claim 29, wherein said analog output signal is stored in a storage element in a feedback path between an output of said second stage and an input of said first stage.

34. The converter of claim 33, wherein said first and second stages are disconnected from one another during a hold phase so that said first stage is auto-zeroed and said second stage holds said analog output signal as a continuous time output.

35. The converter of claim 34, wherein said amplifying circuit further comprises a third amplifier cascaded between said first stage and a node between said integrating capacitor and the output of said second stage during a precharge phase so that parasitic capacitance at said node is driven to the value of said analog output signal.

36. The device of claim 35, wherein said first stage amplifier is configured an a non-inverting amplifier during said amplify phase, and reconfigured as an inverting amplifier during said hold phase.

* * * * *